United States Patent
Crozier et al.

(10) Patent No.: US 7,936,168 B2
(45) Date of Patent: May 3, 2011

(54) MAGNETIC FIELD DOSIMETER

(75) Inventors: Stuart Crozier, Wilston (AU); Stephen James Wilson, Camp Hill (AU); Ian Gregg, Windsor (AU)

(73) Assignee: The University of Queensland, Queensland (AU)

( * ) Notice: Subject to any disclaimer, the term of this patent is extended or adjusted under 35 U.S.C. 154(b) by 178 days.

(21) Appl. No.: 11/663,825

(22) PCT Filed: Sep. 28, 2005

(86) PCT No.: PCT/AU2005/001495
§ 371 (c)(1),
(2), (4) Date: Jan. 18, 2008

(87) PCT Pub. No.: WO2006/034551
PCT Pub. Date: Apr. 6, 2006

(65) Prior Publication Data
US 2008/0204010 A1    Aug. 28, 2008

(30) Foreign Application Priority Data
Sep. 28, 2004   (AU) .............................. 2004905579

(51) Int. Cl.
*G01R 33/02* (2006.01)
*G01R 33/07* (2006.01)
(52) U.S. Cl. ........................................ 324/247; 324/251
(58) Field of Classification Search .................. 324/244, 324/247, 249, 251, 252
See application file for complete search history.

(56) References Cited

U.S. PATENT DOCUMENTS

| 4,672,309 A | | 6/1987 | Gandhi |
| 4,945,306 A | * | 7/1990 | Lowther ........................ 324/220 |
| 5,256,960 A | * | 10/1993 | Novini ............................ 324/72 |
| 5,440,232 A | | 8/1995 | Scarzello et al. |

(Continued)

FOREIGN PATENT DOCUMENTS
CA          914 759         11/1972
(Continued)

OTHER PUBLICATIONS

English translation of DE 19809076 A1, 24 pages, Apr. 2005.*

(Continued)

*Primary Examiner* — Patrick J Assouad
*Assistant Examiner* — David M. Schindler
(74) *Attorney, Agent, or Firm* — Nixon & Vanderhye P.C.

(57) ABSTRACT

A portable device is used to measure exposure to magnetic fields and/or exposure to changes of magnetic field. The device (10) includes a first sensor (14) for measuring instantaneous magnetic field strength, and a second sensor (15) which is located adjacent to, and orientated in the same direction as, the first sensor for providing an output indicative of the time rate of change of the magnetic field. An integrator (22) integrates the rate of change output from the second sensor (15) over time to derive relative changes in the magnetic field. A processor (20) is connected to the outputs of at least the first sensor and the integrator. The processor selectively provides an indication of field strength from the output of the first sensor if the output is within the normal operating range of the first sensor, or otherwise from the integrator. A memory (24) is connected to the output of the second sensor (15) to store cumulative exposure to changes in the magnetic field. Three pairs of first and second sensors may be orientated in respective orthogonal directions.

13 Claims, 3 Drawing Sheets

U.S. PATENT DOCUMENTS

| | | | | |
|---|---|---|---|---|
| 5,629,622 | A * | 5/1997 | Scampini | 324/247 |
| 6,476,610 | B1 * | 11/2002 | Wiegert et al. | 324/345 |
| 6,486,664 | B1 | 11/2002 | Metodiev et al. | |
| 2004/0027119 | A1 * | 2/2004 | Rosenheimer et al. | 324/244 |
| 2004/0068174 | A1 | 4/2004 | Bowman | |

FOREIGN PATENT DOCUMENTS

| | | |
|---|---|---|
| DE | 198 09 076 | 9/1999 |
| DE | 19809076 A1 * | 9/1999 |
| EP | 0 536 447 | 4/1993 |

OTHER PUBLICATIONS

International Search Report mailed Jan. 4, 2006 in PCT/AU2005/001495.

Written Opinion mailed Jan. 4, 2006 in PCT/AU2005/001495.

Schenck, John F., "Safety of Strong, Static Magnetic Fields," J. Magn. Reson. Imag., 12:2-19, 2000).

Liu, Feng, et al, *Journal of Magnetic Resonance*, 161 (2003) pp. 99-107, "Calculation of electric fields induced by body and head motion in high-field MRI."

Crozier, Stuart, et al, *Progress in Biophysics and Molecular Biology*, 87 (2005) pp. 267-278, "Numerical evaluation of the fields induced by body motion in or near high-field MRI scanners."

Schenck, John F., MD, PhD, *Journal of Magnetic Resonance Imaging*, 12 (2000) pp. 2-19, "Safety of Strong, Static Magnetic Fields."

Supplementary European Search Report—issued in corresponding European Application on Nov. 9, 2009.

Fujita, T.Y., Review of Scientific Instruments, vol. 53, No. 3, (1982) pp. 326-331, "Portable magnetic field dosimeter with data acquisition capabilities;" XP000649283.

* cited by examiner

MAGNETIC FIELD DOSIMETER

This application is the U.S. national phase of international application PCT/AU2005/001495 filed 28 Sep. 2005 which designated the U.S. and claims benefit of AU 2004905579, dated 28 Sep. 2004, the entire content of which is hereby incorporated by reference.

This invention relates to a method and apparatus for measuring and recording instantaneous and/or cumulative exposure to magnetic fields. In a preferred embodiment, the invention is a portable device which provides personal and ambulatory dosimetry of magnetic fields, magnetic field gradients and movement through such fields, and is capable of measuring a wide range of field strengths.

BACKGROUND TO THE INVENTION

Repetitive and/or lengthy exposure to static magnetic fields and static magnetic field gradients occurs occupationally in a number of professions, including hospital technicians working with magnetic research imaging (MRI), researchers in experimental high energy physics, and workers in aluminium smelters, for example. While static magnetic fields are recognised as being far less harmful than ionising radiation, repeated exposure to strong static fields is generally treated with advised caution from regulatory bodies and recommendations exist to limit occupational exposure. For example, The National Radiation Protection Board (NRPB) of the United Kingdom guidelines suggests limiting the time-weighted exposure to 0.2 T per 8-hour working day. The guidelines permit higher exposures of 2 T per working day if only extremities, but not the head or trunk, are exposed to the fields.

Furthermore, when a human body moves through static magnetic fields, particularly those that vary in space (as most do), currents are induced in the body. The human body, in electrical terms is effectively a heterogeneous array of conductive dielectric tissues. These currents can disturb biological function (see, for example, John F. Schenck, "Safety of Strong, Static Magnetic Fields", J. Magn. Reson. Reson. Imag. 12: 2-19, 2000).

Dosimetry for ionizing radiation (such as X-rays) is already known and developed. A number of electromagnetic dosimeters have been described in prior art. For example, U.S. Pat. Nos. 4,672,309 and 6,486,664 describe devices to monitor radiofrequency electromagnetic exposure, that is, high frequency exposure.

Exposure to static magnetic field gradients can occur either when a person moves through a static magnetic field that is non-uniform in space or when the static magnetic field is switched from one value to another. Combinations of both these effects are also possible. The fields in and around an MRI magnet provide one example of spatial variation of magnetic fields. An MRI magnet has a volume, usually in the centre of the structure, that generates strong and very uniform static magnetic fields, but strong, long term gradients in the magnetic field exist outside this central region. Some patients experience uncomfortable sensations when moved into an MRI scanner or when moving their head during entry to the scanner, or once in the MRI scanner. Reported sensations include a feeling of falling, magnetophosphenes, a loss of proprioception, a metallic taste in the mouth or muscle twitching (peripheral nerve stimulation).

Similar effects have been described when a field gradient is switched. Field gradients are devices used in MRI machines that generate linear field gradients in the z-component of the static magnetic field. These gradients are used to spatially encode the NMR signal and produce images. They are regularly switched during the creation of an image.

Movement through spatially varying magnetic fields can induce significant eddy currents in the body (L. Feng, H. Zhao and S. Crozier, "Induced fields by body movement and headshake in High-Field MRI", J. Magn. Reson. 161/1 pp 99-107, 2003). It is useful to examine the nature of such field inductions in the body, and a calculation of induced fields in the body and example simulations of motion around a 4 Tesla MRI magnet system can be found in S. Crozier and L. Feng, "Numerical evaluation of the fields induced by body motion in or near high-field MRI scanners", Progress in Biophysics and Molecular Biology, Volume 87, Issues 2-3, February-April 2005, Pages 267-278.

Generally, this simulation shows that field magnitudes induced by typical body movements are less than, but of a similar magnitude to, those induced by switched gradient coils in the MRI scenario and have potential for adverse health effects.

There are many types of the known devices for measuring magnetic field strength, variously known as magnetometers, teslameters, gaussmeters and fluxmeters. Some of these are not portable or otherwise not adapted for ambulatory applications. Hence, they are unsuitable for measuring personal exposure to magnetic fields by persons who may be constantly moving around magnets in the course of their work.

Those magnetometers which are portable commonly use Hall effect sensors or "Hall probes" to sense magnetic fields, as such probes can be manufactured in small sizes. However, a disadvantage of many Hall probes is that they have limited dynamic range due to saturation. Consequently, they are unable to measure or record high field strengths accurately. Although there are some Hall probes with wide operating ranges, they tend to be bulky, expensive and lack resolution at low field strengths.

Most magnetometers are designed to measure instantaneous field strength, and do not record cumulative exposure to magnetic fields.

Further, as outlined above, changes in field strength, such as caused by switched or time-varying magnetic fields or movement through static field gradients, may also have detrimental effects on the human body. Known magnetometers are generally unable to provide an adequate or satisfactory measurement and/or record of changes in magnetic field experienced by a person.

It is an object of this invention to provide an improved method and apparatus for measuring and recording instantaneous and/or cumulative personal exposure to magnetic fields.

SUMMARY OF THE INVENTION

In one broad form, this invention provides an apparatus for measuring magnetic field strength, comprising:

a first sensor for measuring instantaneous magnetic field strength;

a second sensor, located adjacent to, and orientated in the same direction as, the first sensor, for providing an output indicative of the time rate of change of the magnetic field;

an integrator for operatively integrating the rate of change output from the second sensor over time to derive relative changes in the magnetic field; and a processor connected to the outputs of at least the first sensor and the integrator;

wherein the processor selectively provides an indication of field strength from the output of the first sensor or the integrator, depending on the value of the field strength.

In another form, this invention provides a method of measuring magnetic field strength, comprising the steps of measuring instantaneous magnetic field strength with a first sensor;

measuring rate of change of the magnetic field with a second sensor located adjacent to, and orientated in the same direction as, the first sensor;

integrating the rate of change output from the second sensor over time to derive relative changes in the magnetic field, and selectively providing an indication of field strength from the output of the first sensor means or the integration, depending on the value of the field strength.

In a preferred embodiment, the first sensor is a Hall effect sensor or Hall probe which directly measures the magnetic field to which it is exposed. The second sensor comprises a coil device which is responsive to the time rate of change of the magnetic field by the induction of a current or voltage therein. The integrator is an analog or digital integrator which is connected to the output of the coil device. The coil output is integrated to give changes in the magnetic field.

In use, relative changes of magnetic field derived by integration are rendered meaningful or useful by reference to an absolute value which is provided by the first sensor while it is within its operative range.

The processor is typically a microprocessor having appropriate software, or firmware. Within the normal operating range of the Hall probe, the microprocessor selects the output of the Hall probe as the indicator of field strength. However, as a Hall probe saturates or otherwise stops responding in high field strengths, above a predetermined field strength the microprocessor selects the output of the integrator as the measurement of field strength, using a non-saturated output of the Hall probe as a starting point for the integrator.

In this manner, the apparatus can provide accurate measurements over a wide range of magnetic field strengths. In particular, the apparatus is able to use the Hall probe to achieve high resolution at low field strengths, yet is not limited to the normal operating range of the Hall probe. Moreover, by using the combination of the Hall probe and coil, the apparatus has a broad dynamic range, being operable within a bandwidth ranging from 0 Hz (DC) to tens of kilohertz.

Typically, when the output of the integrator falls below the predetermined field strength, i.e. back within the operating range of the Hall probe, the microprocessor switches back to the output of the Hall probe as the measurement of field strength. The output of the integrator is also reset or correlated with the output of the Hall probe.

Preferably, the apparatus has a multiplicity of paired first and second sensors, orientated in a multiplicity of orientations, typically one pair in each of three orthogonal directions. By having a multiplicity of paired sensors, the magnetic field and magnetic field gradients in a multiplicity of orientations can be sensed, allowing both magnitude and direction to be calculated.

Typically, the apparatus (including its battery or power supply) is non-magnetic so as to be useful in high magnetic field environments.

Preferably, the apparatus also includes memory means connected to the outputs of one or more of the first sensor, the second sensor and the integrator for recording cumulative exposure to magnetic fields and/or rate of change in magnetic fields. The memory means may also record peak values, and time-weighted average exposures, and periods of exposures over a preset value, thereby adding to the versatility of the apparatus. (These values may be calculated by a separate processor which receives measurement data from the memory means).

Preferably, the apparatus is portable and can be worn on a person. The sensors may be separate from the remainder of the apparatus.

In another form, the invention provides an apparatus for recording exposure to changes in magnetic fields, comprising a portable sensor adapted to be carried on a person for measuring changes in a magnetic field to which the person is exposed, and memory means connected to the output of the sensor for recording cumulative changes in the magnetic field.

Typically, the sensor includes a coil device which is responsive to the time rate of change of the magnetic field.

In order that the invention may be more fully understood and put into practice, a preferred embodiment thereof will now be described, by way of example, with reference to the accompanying drawings.

DESCRIPTION OF PREFERRED EMBODIMENT

In a preferred embodiment, the invention is a portable dosimeter which measures exposure to magnetic fields and/or rate of change of magnetic fields. More particularly, the dosimeter enables ambulatory monitoring of instantaneous and cumulative exposure to a wide range of static magnetic fields. It also monitors and measures the cumulative amount of static field gradient that the monitored person is exposed to, thus providing field gradient dosimetry.

Figure 1:
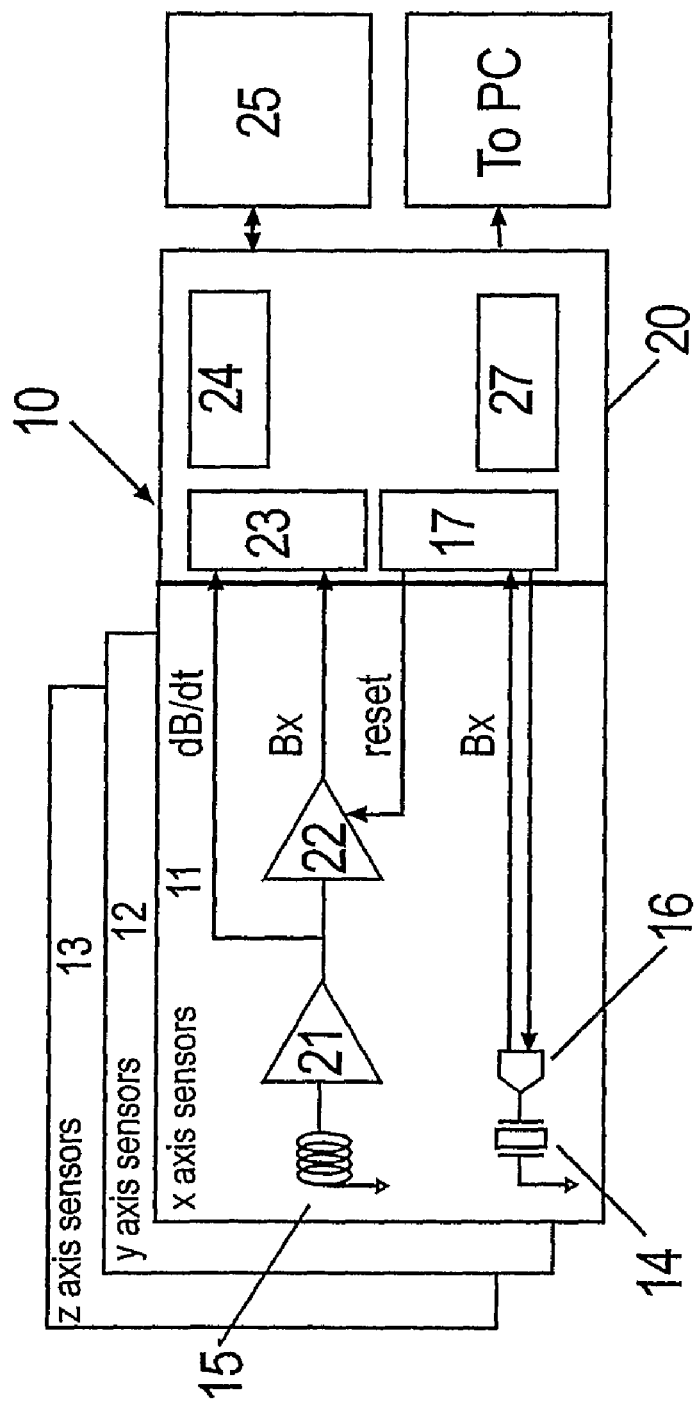
FIG. 1 is a block diagram of a dosimeter according to one embodiment of the invention.

An electrical block diagram of the dosimeter is shown in FIG. 1. The dosimeter 10 comprises three sensor circuits 11,12,13, one for each of the x, y, z axes. Only one sensor circuit 11 is shown in detail in FIG. 1, it being understood that the other two sensor circuits 12,13 are of similar construction.

Each sensor circuit 11,12,13 comprises first and second sensors. In sensor circuit 11, the first sensor is a Hall effect sensor 14 (or Hall probe) used to sense the static magnetic field in one orientation. Co-located with the Hall effect sensor 14 is a coil 15 consisting of at least one loop of wire. Coil 15 acts to sense magnetic field gradients or changes via the Faraday induction principle.

The pair of sensors 14,15 are orientated in the same direction. The three paired sensors of circuits 11,12,13 are preferably orientated in three respective orthogonal directions, thus enabling both the magnitude and direction of the static magnetic field and field gradients to be measured and cumulatively recorded as described below.

The static Hall effect sensor 14 provides direct measurement of small (instantaneous) magnetic field strengths. Its analogue output is converted to digital form by an analog-to-digital ("ADC") converter 16, and fed to a digital input/output circuit 17 of a microprocessor 20.

Any changes in the magnetic field sensed by the Hall effect sensor 14 will induce a current in the coil 15, which in turn, generates a voltage across the coil. This is normally a small voltage which is buffered and amplified in buffer amplifier 21.

The output of amplifier 21 is then integrated by integrator 22 using low-drift analog circuitry, to give changes in magnetic field strength from a known starting point. The static field sensor 14 provides the known starting point for the magnetic field changes derived from the coil 15. The integrator 22 can be reset at any time by the microprocessor 20 which controls the operation of the dosimeter 10.

Both the amplified output of coil 15 and its integral from integrator 22 are fed to ADC 23 where they are digitised and input to the microprocessor 20. Thus, both the magnetic field strength and changes in the magnetic field strength are measured.

Hall effect sensors have limited range, however. The static Hall effect sensor 14 provides accurate measurement of small magnetic field strengths but may saturate or stop responding in high magnetic fields. When the field strength is within the operational range of the Hall effect sensor, the microprocessor 20 selects the output of the sensor 14 as the field strength measurement. When the field strength is above a predetermined value (which is usually set at slightly below the specified upper operating limit of the sensor 14), the microprocessor 20 selects the integrated output of the coil 15 as the field strength measurement. (This integrated output is regularly calibrated against the output of the Hall effect sensor 14 when the field strength is within the operational range of the Hall effect sensor).

Figure 3:
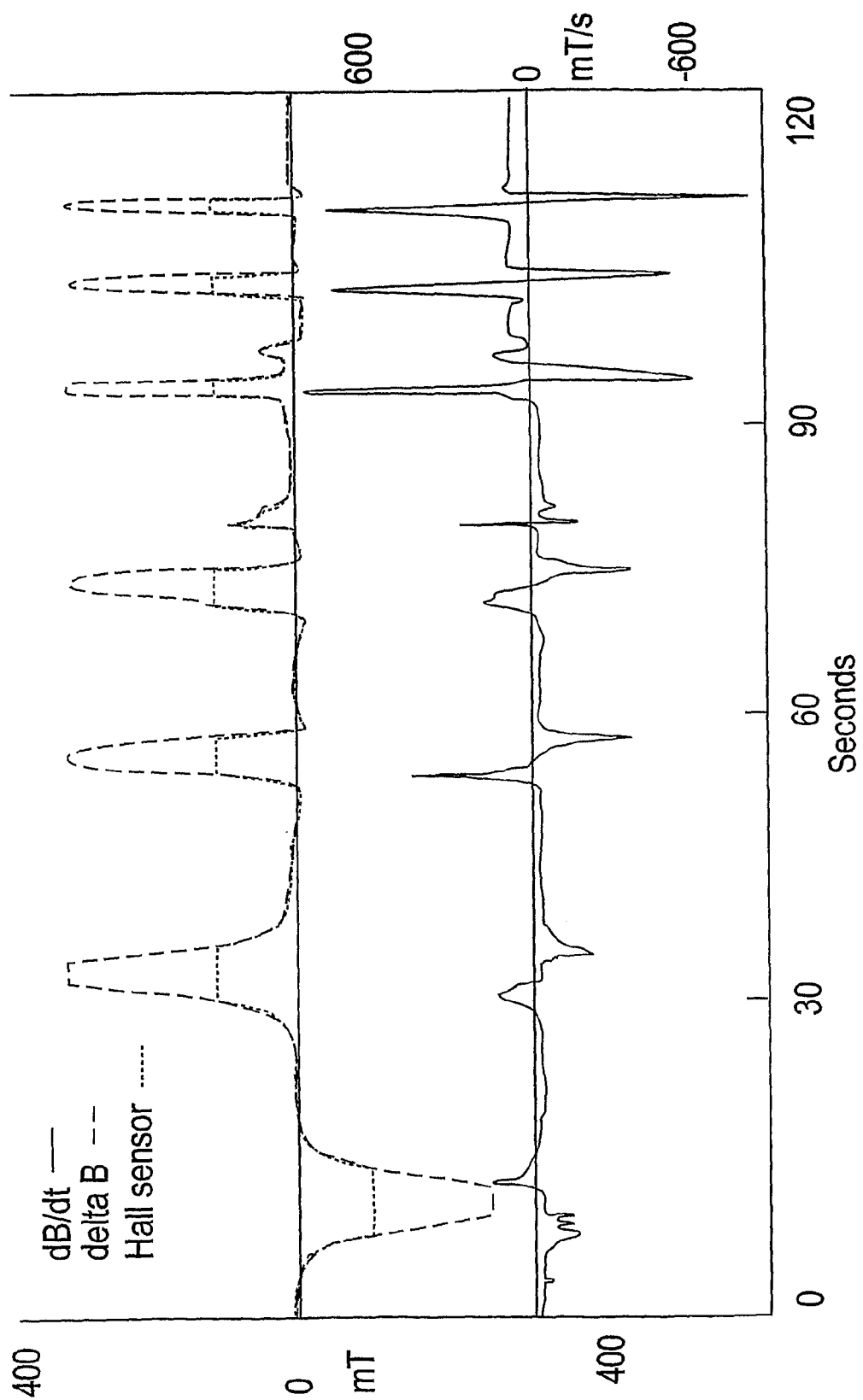
FIG. 3 is a graph of field strength and field changes measured by the dosimeter of FIG. 1.

This is illustrated in FIG. 3 which is a time series plot of the output voltage of the Hall effect sensor and the voltage induced in a coil adjacent to the Hall sensor which is proportional to the rate of change of the magnetic field (dB/dt). Also shown is the result of integration of the coil voltage (deltaB) which has been scaled and superimposed on the hall sensor output. The data was collected as a health care worker walked around a 4 T MRI magnet. It can been seen that, by selective utilisation of the deltaB output, the dosimeter can measure magnetic field strengths far in excess of the normal operating range of the Hall effect sensor, yet retain the benefit of the high resolution of the Hall effect sensor at low field strengths.

That is, the output from the field gradient sensor 15 is integrated to give changes in static magnetic fields and combined with the reading from the Hall effect sensor 14 prior to saturation or exceeding of range. The microprocessor 20 calculates a total static magnet field, which is cumulatively recorded. This advantageous feature allows the dosimeter 10 to be a multi-ranging device which can accommodate and accurately measure small magnetic field values away from strong sources and very high magnetic fields close to sources, thus overcoming the limitations of a device for static field dosimetry based only on Hall effect sensors and giving a large dynamic range of measurement as is required in MRI dosimetry and for other applications.

The microprocessor 20 also measures and records cumulative exposure to field gradients (from the direct reading of the output of amplifier 21.

The microprocessor 20 can be programmed to provide tailored reports, such as peak field and/or gradient exposure, weighted averages of field strength and/or gradients, periods of exposure to field strength and/or gradients above a preselected value. The microprocessor 20 can also be programmed to generate an alarm when one or more such exposure parameters exceeds a pre-selected limit.

The dosimeter 10 can be manufactured as a small battery-powered portable device which can be encapsulated in a compact plastic housing and carried or worn personally. All of the components of the dosimeter are non-magnetic, enabling it to be used in high strength magnetic fields.

Figure 2:
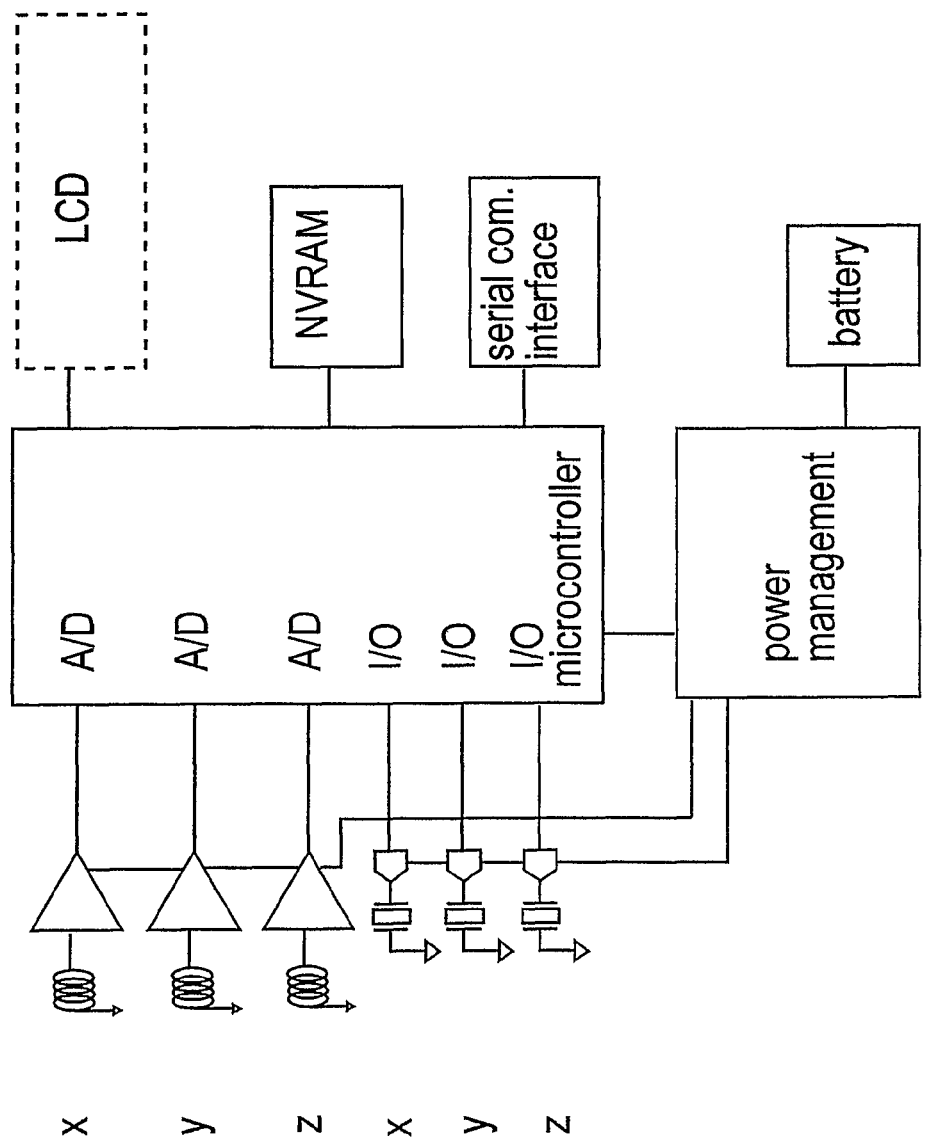
FIG. 2 is another block diagram of the dosimeter of FIG. 1.

Another block diagram of the dosimeter 10 is shown in FIG. 2. (A circuit diagram of the dosimeter 10 can be found in related Australian patent application no. 2004905579, the disclosure of which is incorporated herein by reference.)

As shown in FIG. 2, a power supply in the form of a battery and battery management system is used to permit the device to be conveniently used as an ambulatory device. The requirements for this application include non-magnetic construction, multi-voltage output and high efficiency. (Primary cells and batteries available commercially are usually encased in ferromagnetic materials and can pose serious ballistic dangers if taken into proximity of a high static magnetic field.) A cell based on lithium-ion chemistry is used as it avoids the drawbacks of cells with ferromagnetic components. Such cells are available in small physical sizes suitable for pocket or belt worn devices.

The varied nature of the electronics within the preferred embodiment prescribes multiple voltage supplies or rails within the instrument. Analog amplification, Hall sensors and microcontroller integrated circuits require different supply voltages for operation. The conventional approach to such problems is the use of a switchmode supply converter. Such a technique is based on the electrical properties of an inductor when alternating current is applied. Inductors suitable for such roles possess iron powder cores (ferrite), the magnetic properties of which saturate at high static magnetic fields. To avoid this incompatibility, an inductorless or switched capacitor power supply is preferred. The efficiency of such a technique is comparable to an inductor based technique and the components used in this implementation will tolerate large static and alternating magnetic fields.

Referring to FIG. 1, the dosimeter 10 also includes suitable data storage media, preferably both a fixed internal memory 24 and a removable memory 25, such as flash memory. The dosimeter 10 may have a display 26, such as an LCD, and a port 27 for external communication with a computer or docking station. When a display is fitted, the dosimeter 10 may be used as a field or field gradient mapping system.

The foregoing describes only one embodiment of the invention, and modifications which are obvious to those skilled in the art may be made thereto without departing from the scope of the invention.

For example, the embodiment described above uses low drift analogue integration. However, the signal can be digitised and numerically integrated in an alternative technique to achieve the integration result.

Further, the Hall effect sensor may be replaced by a suitable magneto-strictive device or other magnetic field sensing element.

In the illustrated embodiment, the sensors 14,15 are co-located with the microprocessor 20 within the dosimeter housing. In an alternative embodiment, the Hall and loop sensors are located remotely from the dosimeter electronics. For example, the sensors 14,15 may be clipped on a shirt collar, thereby giving an estimate of exposure dosage to the head; while the remainder of dosimeter may be kept in a pocket in communication with the sensor outputs.

In another embodiment of the invention, the dosimeter is used simply to record cumulative exposure to changes or gradients in a magnetic field. This embodiment uses a coil sensor as described above, the output of which is digitised and stored in the microprocessor. Preferably, the cumulative exposure to the magnetic field strength, as measured by a Hall probe or equivalent device, is also recorded.

The method and apparatus of this invention can also be used to verify or produce field plots around magnets.

Throughout this specification, including the claims, where the context permits, the term "comprising" or "comprises" is to be interpreted in the inclusive sense as including the stated integer(s) without necessarily excluding others.

The invention claimed is:

1. Apparatus for indicating strength of a magnetic field, comprising:
   a first sensor for measuring instantaneous magnetic field strength, the first sensor having an output providing an indication of instantaneous strength of a magnetic field in which the first sensor is operatively located, and wherein the first sensor is oriented in a direction called a first sensor direction;
   a second sensor oriented in said first sensor direction and located adjacent to the first sensor and orientated so that it senses magnetic field in a same direction as the first sensor, the second sensor having an output providing an indication of rate of change of the strength of the magnetic field with respect to time;
   an integrator for integrating the output from the second sensor over time to derive relative changes of the strength of the magnetic field, the integrator having an output; and
   a processor connected to the outputs of at least the first sensor and the integrator;
   wherein the processor selectively provides an indication of the strength of the magnetic field from the output of the first sensor or the output of the integrator, depending on the strength of the magnetic field.

2. Apparatus as claimed in claim 1, wherein the apparatus has a plurality of pairs of said first and second sensors, each pair being orientated in a respective orientation.

3. Apparatus as claimed in claim 1, wherein the apparatus has three pairs of said first and second sensors, each pair of first and second sensors being orientated in a respective one of three orthogonal directions.

4. Apparatus as claimed in claim 1, wherein the first sensor is a Hall effect sensor.

5. Apparatus as claimed in claim 1, wherein the second sensor comprises a coil device which is responsive to change of strength of the magnetic field with respect to time.

6. Apparatus as claimed in claim 1, wherein the output of the first sensor has a predetermined normal operating range and the processor is programmed to select the output of the first sensor as the indication of the strength of the magnetic field if the output of the first sensor is within the normal operating range of the first sensor, or otherwise the processor selects the output of the integrator as the indication of the strength of the magnetic field, using a predetermined value within the normal operating range of the output of the first sensor as a starting point for integrating the output from the second sensor over time.

7. Apparatus as claimed in claim 1, further comprising a memory connected to one or more of the output of the first sensor, the output of the second sensor and the output of the integrator, for recording cumulative exposure to the magnetic field and/or rate of change in the magnetic field.

8. Apparatus as claimed in claim 1, wherein the apparatus is portable and adapted to be worn on a person.

9. Apparatus as claimed in claim 1, wherein the apparatus is constructed of non-magnetic materials.

10. A method of indicating strength of a magnetic field, comprising
    placing a first sensor in the magnetic field and measuring the strength of the magnetic field with the first sensor, the first sensor having an output providing an indication of instantaneous strength of the magnetic field, and wherein the first sensor is oriented in a direction called a first sensor direction;
    placing a second sensor oriented in said first sensor direction and adjacent to the first sensor in the magnetic field and orientated so that the second sensor senses magnetic field in a same direction as the first sensor;
    measuring change of the strength of the magnetic field with respect to time with the second sensor, the second sensor having an output providing an indication of rate of change of the strength of the magnetic field with respect to time;
    using an integrator to integrate the output from the second sensor over time to derive relative changes of the strength of the magnetic field, the integrator having an output, and
    selectively providing an indication of the strength of the magnetic field from the output of the first sensor or the output of the integrator, depending on the strength of the magnetic field.

11. A method as claimed in claim 10, wherein the output of the first sensor has a predetermined normal operating range and the output of the first sensor is selected as the indication of the strength of the magnetic field if the output of the first sensor is within the predetermined normal operating range of the first sensor, or otherwise the output of the integrator is selected as the indication of the strength of the magnetic field.

12. A method as claimed in claim 10, wherein the output of the first sensor has a predetermined normal operating range and a predetermined value within the normal operating range of the first sensor is used as a starting point for the integration.

13. A method as claimed in claim 10, wherein when the output of the first sensor is selected as an indication of the strength of the magnetic field following a period when the output of the integrator has been used as an indication of the strength of the magnetic field, the output of the integrator is reset to correlate with the output of the first sensor.

* * * * *